United States Patent [19]
Rolfe et al.

[11] Patent Number: 4,703,484
[45] Date of Patent: Oct. 27, 1987

[54] PROGRAMMABLE INTEGRATED CIRCUIT FAULT DETECTION APPARATUS

[75] Inventors: Robert M. Rolfe, Melbourne; Lee J. Falkenstrom, Indialantic, both of Fla.

[73] Assignee: Harris Corporation, Melbourne, Fla.

[21] Appl. No.: 810,941

[22] Filed: Dec. 19, 1985

[51] Int. Cl.$^4$ ............................................. G01R 31/28
[52] U.S. Cl. .................................... 371/25; 324/73 R; 371/15
[58] Field of Search ................. 371/25, 15; 324/73 R, 324/73 AT

[56] References Cited

U.S. PATENT DOCUMENTS

| | | | |
|---|---|---|---|
| 4,220,917 | 9/1980 | McMahon, Jr. | 324/73 R |
| 4,441,075 | 4/1984 | McMahon | 324/73 R |
| 4,476,560 | 10/1984 | Miller et al. | 371/15 |
| 4,485,472 | 11/1984 | Sproull et al. | 371/15 |
| 4,494,066 | 1/1985 | Goel et al. | 324/73 R |
| 4,503,386 | 3/1985 | Das Gupta et al. | 324/73 R |
| 4,504,784 | 3/1985 | Goel et al. | 324/73 R |
| 4,509,008 | 4/1985 | Das Gupta et al. | 324/73 R |
| 4,566,104 | 1/1986 | Bradshaw et al. | 371/15 |
| 4,575,674 | 3/1986 | Bass et al. | 324/73 R |
| 4,621,363 | 11/1986 | Blum | 371/25 |

Primary Examiner—Charles E. Atkinson
Attorney, Agent, or Firm—John L. DeAngelis, Jr.

[57] ABSTRACT

An integrated circuit fault detection system. The integrated circuit fault detection system includes gate means associated with each functional input and functional output of the chip. The gate means are connected between the functional input and functional output terminals and the bonding pad and are controllable to allow the chip to operate in normal fashion using the input and output terminals thereof and the bonding pads associated therewith. The gate means are also controllable to read test data into a functional input terminal of the chip, write test data out of the functional output terminal of the chip, drive test data from chip functional circuitry through the bonding pad off chip, and accept test data from the outside world through a bonding pad and transfer the test data to chip functional circuitry. The test results can then be analyzed to determine if the chip is functioning properly.

15 Claims, 5 Drawing Figures

PROGRAMMABLE INTEGRATED CIRCUIT FAULT DETECTION APPARATUS

FIELD OF THE INVENTION

This invention relates to a fault detection apparatus for isolating individual circuits of an integrated circuit to detect faults within and between integrated circuit chips.

BACKGROUND OF THE INVENTION

With the increasing complexity of integrated circuits and evolution to large scale integration (LSI), very large scale integration (VLSI), and very high-speed integrated circuits (VHSIC) testability issues have become of paramount importance. Whereas in the past integrated circuits were relatively small and contained only simple structures, today's most advanced integrated circuits are extremely complex and contain hundreds of thousands of circuit elements. The simplicity of the early integrated circuits made testing simple and if the integrated circuit failed a test, it was cost effective to simply throw out the bad chip. Further, testing of such simple integrated circuits is straight forward because there are few, if any, inaccessible circuits on the chip and chip simplicity allows quick and thorough testing.

With the advent of LSI, VLSI, and VHSIC chips, direct accessibility to individual circuits on the chip is greatly limited. This is due to the vastly increased number of circuits on the chip and to the microscopic dimensions of these circuits. Testing these circuits is a major concern in today's electronics industry. The problem of testing LSI, VLSI, and VHSIC chips is further aggravated by the presence of inaccessible storage elements or latches that are typically embedded among combinatorial logic networks. Without an assured technique for setting and examining the logic states of these embedded latches, there can be no effective testing of the associated combinatorial logic networks. Yet reliable and thorough testing of all LSI, VLSI, and VHSIC chips is indispensable in manufacturing as well as maintenance.

Two popular techniques for testing today's integrated circuits are functional tests and structural tests. Functional testing uses the normal circuit behavior to test the integrated circuit. In functional testing, the integrated circuit is operated to output a sequence of test data based on an appropriate input sequence of test data. Comparing the desired output test data with the test results from the chip provides a determination of the condition of the chip. The various input test data can be applied to the chip for testing various logic blocks of the chip. From a system's level viewpoint, functional testing can be accomplished during normal chip operation or during a designated test sequence.

It is obvious, however, that as the number of logic circuits on the chip increases many of the logic circuits cannot be adequately tested with the functional scheme. Although functional testing is currently the most popular test technique, it also provides the lowest degree of test effectiveness in detecting all possible "stuck at" faults and requires the highest level of customization, i.e., designing the chip to accommodate the testing features. Functional testing requires isolation of the chip under test and the test data must simulate the circuitry to which the chip would normally be connected. Thus, in addition to incomplete controllability and accessibility, there are also more places for the test circuitry itself to fail, thus giving a false error detection or inhibiting the reporting of a real operational fault. Functional circuit testing also requires the test circuitry to be customized to match the architecture and functions of the chip under test and ironically, may require as much or more effort to design than the chip to be tested.

Structural testing involves the use of on-chip circuitry dedicated to chip testing. The structural technique does not require an understanding of the function of each integrated circuit block, and therefore can be developed in a generic way to be applicable to a large class of LSI, VLSI, or VHSIC chips. The most popular structural test technique is the scan-in/scan-out (or level sensitive scan design, LSSD) methodology. With this system, in the test mode all the latches in a circuit are arranged into a string of shift registers and test data is clocked through the string to test for bad latches. Test data is then loaded into the combinatorial logic in parallel and shifted out in series to check the combinatorial logic that connects the latches together.

SUMMARY OF THE INVENTION

The present invention offers advantages associated with both the functional and structural testing techniques and also allows for the testing of second level faults, i.e., faults between integrated circuits connected into a system configuration. The present invention detects stuck-at faults, bridging faults, and faults between the functional segments of a chip and the input/output pads. Bridging faults are shorts between two or more interconnect lines of the chip, caused by mask defects or other abnormalities during chip processing. Pull-up resistors included in the present invention and to be discussed hereinafter allow detection of bridging faults.

The advantages offered by the present invention are accomplished by inserting a bidirectional gate between each I/O (input/output) bonding pad and the functional chip circuitry to which it is connected. Various test modes are available for writing data into or reading data from the chip functional circuits or for writing data into or reading data from the chip I/O pads. Selection of the desired test mode is accomplished by properly configuring the bidirectional gate. By writing data into an I/O pad and then reading the data from an interconnected (i.e., on another chip) I/O pad the interconnections between chips (where approximately ninety percent of the faults exist) can be tested. The prior art schemes do not provide for testing of this critical interconnect path because access to the I/O pads is lost when the chip is inserted into a system.

The test circuitry associated with each I/O pad is connected in a ring fashion so that test data inputs are provided to the chip at a single location and transferred around the ring to the appropriate gate for testing a particular circuit or I/O pad interconnection of the chip. Test results also circulate around the ring, eventually being transferred off-chip for analysis. Advantageously, the test scheme of the present invention can be time multiplexed for activation during interrupts in system operation. Time multiplexing allows use of the functional I/O pins for chip testing, thus limiting the number of extra pins required. Time multiplexing also provides nearly-immediate detection of chip faults within the system environment, so that corrective action can be initiated immediately.

Although the test scheme of the present invention is ideally suited for testing LSI, VLSI, and VHSIC chips, its use is not limited to those integrated circuit families. It can be used with any family where interconnect testing and thorough chip circuit testing is desirable.

BRIEF DESCRIPTION OF THE DRAWINGS

The present invention can be more easily understood, and the advantages and uses thereof more readily apparent, when considered in view of the description of the preferred embodiments and the following figures in which.

DESCRIPTION OF THE PREFERRED EMBODIMENTS

Figure 1:
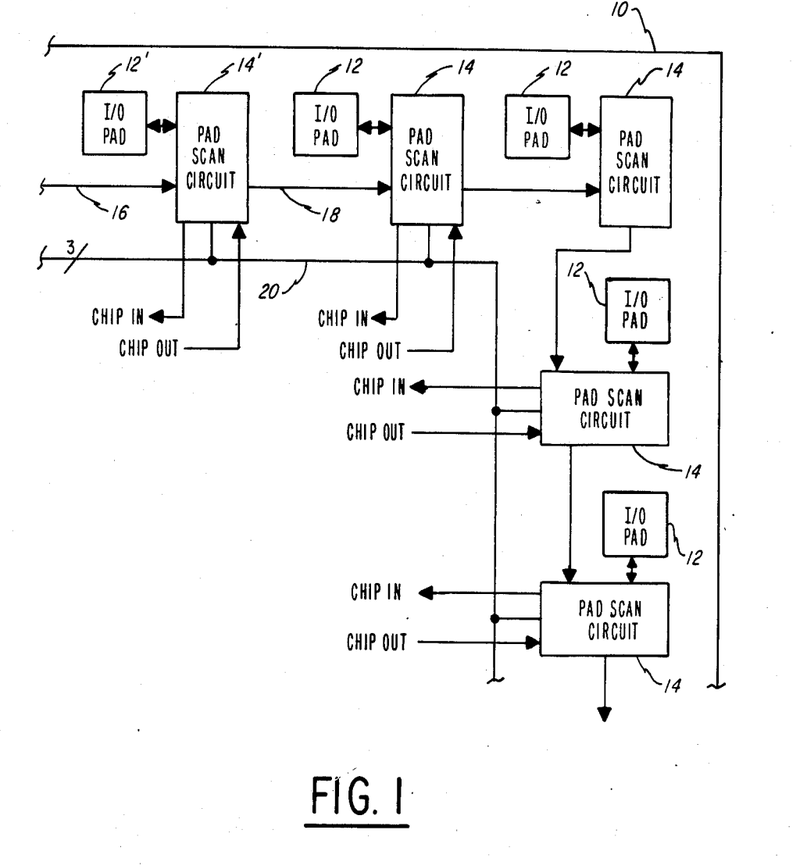
FIG. 1 is a block diagram illustrating a partial floor plan of an integrated circuit including the fault detection apparatus of the present invention.

FIG. 1 is a partial floor plan of an integrated circuit chip incorporating the principles of the present invention. The perimeter of the integrated circuit is identified by reference character 10 and the I/O (input/output) pads illustrated in FIG. 1 are designated by reference character 12. The principles of the present invention are adaptable to an integrated circuit of any complexity and containing any number of I/O pads. Each I/O pad 12 is connected to a pad scan circuit 14 to transfer data bi-directionally between the I/O pad 12 and the pad scan circuit 14. Each pad scan circuit 14 is also connected to the chip functional circuitry via chip-in and chip-out lines. Thus, each pad scan circuit 14 is interposed between the I/O pad 12 and the chip functional circuitry. (In some embodiments it may be necessary to interpose an interface circuit between the chip functional circuitry and the pad scan circuitry 14.) FIG. 1 illustrates an application of the present invention to a memory device or any other device where data is read into and out of the same functional area of a chip via a single I/O pad. That is, the teachings of the present invention as depicted in FIG. 1 can be applied to any bidirectional pin of an integrated circuit. As will be discussed in conjunction with FIGS. 3 and 4, the features of the present invention are also applicable to an integrated circuit where each I/O pad is used only as a data input point or a data output point. In these embodiments each pad scan circuit 14 is connected to only a chip input circuit or a chip output circuit, dependent on whether the I/O pad is dedicated to an input or an output function.

With respect to the pad scan circuit designated 14′, input test data and control data are supplied as an input thereto via a scan-in line 16; output test data and control data are sent from the pad scan circuit 14′ over a scan-out line 18. The pad scan circuit 14′ controls operation of the I/O pad 12′ and provides input test data to and retrieves output test data from the chip functional circuitry (via the chip-in and chip-out lines). The scan-out line for any particular pad scan circuit 14 is also the scan-in line for the next pad scan circuit 14 in the ring.

A test access bus 20 (comprising three conductors) is also illustrated in FIG. 1 connected to each of the pad scan circuits 14. The test access bus 20 carries control data controlling the operation of each pad scan circuit 14, as will be more fully explained in conjunction with the discussion of FIG. 2. As will be more fully appreciated after the discussion of FIG. 2, test data can be entered into the chip via any of the I/O pads 12 and the results taken off chip for analysis via any of the I/O pads 12. Thus, it is not necessary to have an I/O pad and corresponding integrated circuit pins dedicated for providing test data to the chip or retrieving test results from the chip. However, the present invention does not pre-empt the use of dedicated pins for input and output test data if so desired.

The use of the pad scan circuits 14 for each I/O pad allows complete testing of two paths overlooked in prior art test techniques. In the prior art designs, after the chip is inserted into a system, the signal path from each pad to the first scanning test register cannot be tested completely without the aid of external devices. This is due to the loss of access to individual chip pads once a chip leaves its test environment. The present invention allows test data to be serially clocked into each or any I/O pad 12 and then read out at each or any other I/O pad 12. For more complete testing, several or all of the I/O pads 12 can be set to a desired initial state, the data allowed to propagate through the functional circuits of the chip and the results scanned out from any I/O pad 12 for verification.

A second feature offered by the pad scan circuit 14 is continuity and propagation delay testing of interconnects between chips in their system environment. In the same manner as with the internal chip test, data is driven from the pad off-chip to be captured by the pad of an interconnected chip. At the interconnected chip the test results can be scanned out to determine the continuity of the interconnect and the propagation delay time between the two connected chips.

Figure 2:
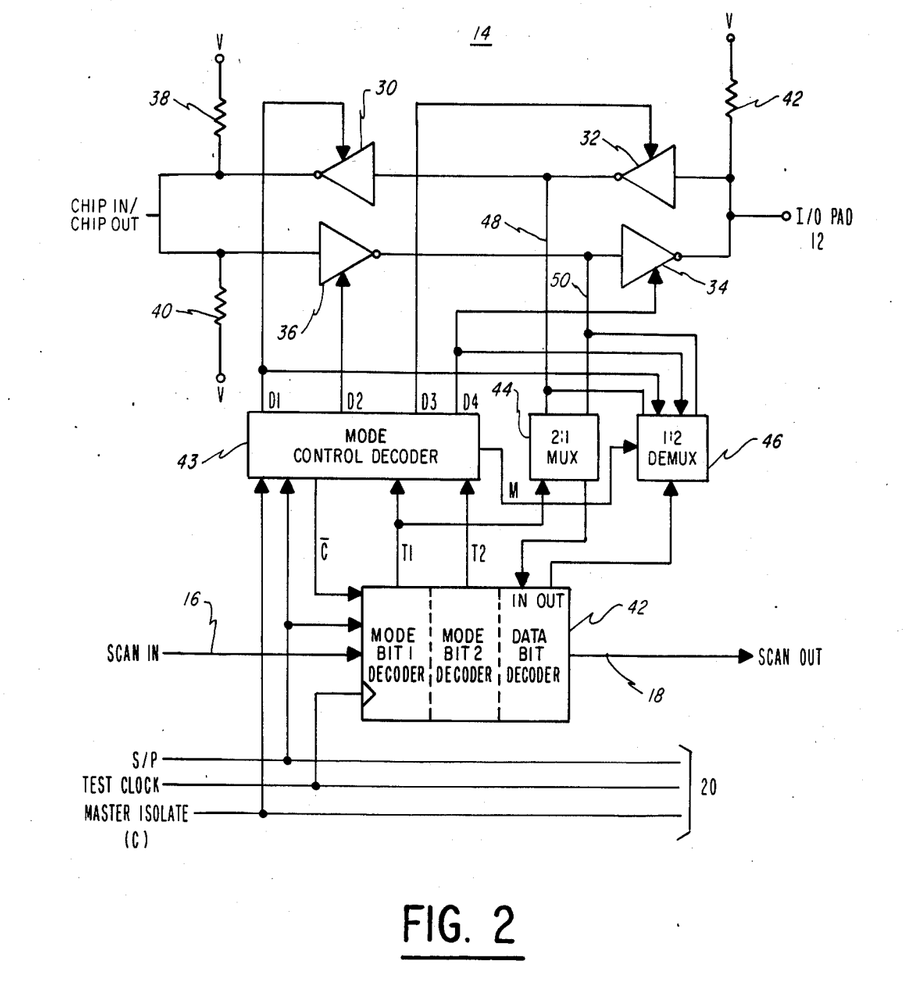
FIG. 2 is a block diagram of the fault detection apparatus of the present invention.

FIG. 2 shows one embodiment of the internal structure of a pad scan circuit 14. The pad scan circuit 14 includes tri-state buffers 30, 32, 34, and 36 controlled by a mode control decoder 43. Data is provided to the tri-state buffers 30 and 34 via a multiplexer 44; data is read from the tri-state buffers 32 and 36 by a demultiplexer 46. Test and control data is supplied to the pad scan circuit 14 via the scan-in line; test and control data is sent from the pad scan circuit 14 to the next pad scan circuit in the ring via the scan-out line. A serial/parallel scan register 42 is responsive to the signal on the scan-in line, for providing appropriate control signals to a mode control decoder 43, the multiplexer 44, and the demultiplexer 46. The serial/parallel scan register 42 is responsive to the signal from the multiplexer 44 and provides the signal on the scan-out line.

The signal on the scan-in (and scan-out) line can be segregated into three-bit groups. The first and second bits (i.e., mode bits) control the operational mode of the pad scan circuit 14; the third bit is a data bit, either input data to be supplied to the chip's functional circuitry or output data provided by the chip's functional circuitry. The serial/parallel scan register 42 is responsive to the S/P, test clock, and $\overline{C}$ signals; the former two carried by the test access bus 20. The S/P and $\overline{C}$ signals are necessary for setting the operating mode of the pad scan circuit 14. The test clock signal clocks the three bits through the serial/parallel scan register 42, and thus clocks these bits around the ring of pad scan circuits 14 illustrated in FIG. 1. The mode control decoder 43 is responsive to the mode control bits (via lines T1 and T2) and the master isolate and S/P signals for controlling the tri-state buffers 30, 32, 34, and 36.

Table 1 below shows the state for each control signal to provide the various operational modes of the pad scan circuit 14. When the FIG. 2 I/O pad 12 is in a normal input mode (chip input), the S/P line is high and the tri-state buffers 30 and 32 are configured by the mode control decoder 43 to allow data transfer between the I/O pad 12 and the functional circuits of the chip via the conductor labelled "Chip In." In the normal output mode (chip output) the tri-state buffers 34 and 36 are configured to allow data transfer from the chip functional circuits to the I/O pad 12 via the conductor labelled "Chip Out."

TABLE 1

| Function | Inputs | | | | Outputs | | | | |
|---|---|---|---|---|---|---|---|---|---|
| | C | S/P | T1 | T2 | D1 | D2 | D3 | D4 | M |
| Chip Input | 0 | 1 | X | 0 | 1 | 0 | 1 | 0 | X |
| Chip Output | 0 | 1 | X | 1 | 0 | 1 | 0 | 1 | X |
| Chip I/O | 0 | 1 | 1 | X | 1 | 1 | 1 | 1 | X |
| Read Chip | 0 | 0 | 0 | 0 | 0 | 1 | 0 | 0 | 0 |
| Write Chip | 0 | 0 | 0 | 1 | 0 | 0 | 0 | 1 | 0 |
| Read Pad | 0 | 0 | 1 | 0 | 0 | 0 | 1 | 0 | 1 |
| Write Pad | 0 | 0 | 1 | 1 | 1 | 0 | 0 | 0 | 1 |
| Chip Isolate | 1 | X | X | X | 0 | 0 | 0 | 0 | X |

| Truth Table Entries | Signal Definitions |
|---|---|
| 1 = Logical High | C = Master Isolate Line |
| 0 = Logical Low | S/P = Serial/Parallel Line |
| X = Don't Care | T1 and T2 = Mode Select Lines |
| | D1, D2, D3, and D4 = Tri-State Buffer Control Lines |
| | M = Multiplexer and Demultiplex Control Line |

The output signals of Table 1 are defined by the following equations.

$$D1 = [\overline{(\overline{C} + S/P + \overline{T2})} \cdot \overline{(C + \overline{S/P} + T1 + T2)}] \quad (1)$$

$$D2 = [\overline{(\overline{C} + \overline{S/P} + \overline{T2})} \cdot \overline{(C + S/P + T1 + \overline{T2})}] \quad (2)$$

$$D3 = [\overline{(\overline{C} + S/P + \overline{T2})} \cdot \overline{(C + T1 + \overline{T2})}] \quad (3)$$

$$D4 = [\overline{(\overline{C} + S/P + T2)} \cdot \overline{(C + T1 + T2)}] \quad (4)$$

There are four test modes and one isolate mode for the pad scan circuit 14. In the read-chip mode the chip is isolated from the outside world and the tri-state buffer 36 is enabled. Data is read from the chip functional circuit into the serial/parallel scan register 42 via the multiplexer 44, and is then read out over the scan-out line under control of the test clock signal. In the write-pad mode the internal chip functional circuit is isolated from the I/O pad 12. The tri-state buffer 34 is enabled to allow a test bit from the serial/parallel scan register 42 (via the multiplexer 44) to be driven outside the chip. In the read-pad mode the internal chip functional circuit is isolated from the I/O pad 12. The tri-state buffer 32 is enabled to allow the reading of data from outside the chip via the I/O pad 12 to the multiplexer 44 then to the serial/parallel scan register 42. In the write-chip configuration the chip is isolated and the tri-state buffer 30 is enabled. Test data can then be driven into the chip functional circuit from the serial/parallel scan register 42 via the demultiplexer 46. In the isolate mode the chip and the outside world are effectively isolated from the test circuitry. This isolation is important to eliminate the possibility of transients during loading of the serial/parallel scan register 42. This mode can also be used to provide quick chip protection when a system failure occurs. Table 1 shows the necessary control signal states for each of these test modes, the isolate mode, and the normal operating modes.

The test access bus 20 contains three individual lines in FIG. 2. The lines are labeled as follows: S/P, (serial/parallel), Test Clock, and Master Isolate (C). The signal on the S/P line determines whether the pad scan circuit 14 operates in the serial or parallel mode. The clock signal on the test clock line scans data from one pad scan circuit 14 to the next pad scan circuit 14 in the ring. The master isolate clock signal effectively isolates the entire chip from the outside world, electrically eliminating the chip from the surrounding circuit board.

The mode control decoder 43 requires four input lines (labeled master isolate (C), S/P, T1 and T2) to configure the tri-state buffers 30, 32, 34, and 36. The signals on these four input lines are decoded to produce control signals on five control lines. In FIG. 2 the control lines are designated D1 through D4 and M. Table 1 and equations (1) through (4) give the truth table for the mode control decoder 42 and the output equations for the signals on control lines D1 through D4. The control signals D1 through D4 control the tri-state buffers 30, 32, 34, and 36, respectively, to enable the proper tri-state buffer(s) required for each mode discussed above. Control line M controls the demultiplexer 46 to select either a data bus 48 or a data bus 50 illustrated in FIG. 2. Control signal T1 determines whether the demultiplexer 44 selects data bus 48 or data bus 50. The multiplexer 44 transfers the signal on the selected data bus (either data bus 48 or data bus 50) to the data bit decoder of the serial/parallel scan register 42. This bit represents the results of a test and will be clocked off-chip under control of the test clock signal. Similarly, the demultiplexer 46 transfers the bit at the output terminal of the data bit decoder to either the data bus 48 or the data bus 50, as determined by the control signal M, for testing the chip functional circuitry or an interconnect between chips.

Operation of the pad scan circuit 14 proceeds as follows. First there is an initialization operation wherein the chip and the outside world are isolated from the pad scan circuit 14. This is accomplished by placing a digital one on the master isolate line of the test access bus 20. A digital one on the S/P line of the test access bus 20 establishes the serial mode of operation. Data and mode bits (which determine the operational mode as discussed above) are then clocked in around the serial test scan ring under control of the test clock signal on the test access bus 20. There are two mode bits and a single data bit for each pad scan circuit 14. Therefore, the total number of mode bits plus data bits to be clocked in around the serial test scan ring is equal to 3N, where N equals the number of pads on the chip. This completes the initialization, after which operation proceeds to either the normal or test mode. In another embodiment it may be desirable to clock the test data in with an address indicating the pad scan circuit for which it is intended; this would require a master controller to decode the address and provide the proper data to the correct pad scan circuit 14.

In either of the two normal modes (i.e., chip input or chip output), the chip operates in a normal manner and the pad scan circuit 14 is in a passive state, allowing normal operating data to flow into and out of the I/O pad 12. For normal operation, the pad scan circuit 14 is left in the serial mode and the master isolate line is returned to zero to enable the decoding circuitry in the serial/parallel scan register 42. Specifically, the mode decoding circuitry is labeled mode bit 1 decoder and mode bit 2 decoder in FIG. 2. The mode bit 1 and mode bit 2 decoders of the serial/parallel scan register 42 decode the data clocked into the serial/parallel scan register 42 during initialization and decode the mode data with the results appearing on the lines T1 and T2. Using the signals provided as an input (i.e., C, S/P, T1, and T2) the mode control decoder 43 configures output lines D1, D2, D3, and D4. Specifically, in the normal operation chip input mode the tri-state buffers 30 and 32 are configured to allow data to pass from the I/O pad 12 to the chip functional circuitry, while the tri-state buffers 34 and 36 are open. This allows the I/O pad 12 to function as an input point. In the normal operation output mode, the mode bit 1 and mode bit 2 decoders respond to the mode bits by configuring trin-state buffers 34 and 36 so that data passes from the chip functional circuitry to the I/O pad 12; the tri-state buffers 30 and 32 are open. Thus, the I/O pad 12 functions as an output terminal.

If it is desired to move to one of the test modes after system initialization, a digital zero is placed on the S/P line of the test access bus 20 to place the pad scan circuit 14 in a parallel mode. The master isolate line is driven low (zero) to take the pad scan circuit 14 out of isolation. The mode bit 1 and mode bit 2 decoders decode the mode bits driven into the pad scan circuit 14 during initialization to determine which of the four test modes or the chip-isolate mode is desired. The results of the decoding process appear on the lines T1 and T2 and are provided as an input to the mode control decoder 43. The mode control decoder 43 produces control signals on lines D1, D2, D3, D4, and M for configuring the tri-state buffers 30, 32, 34, and 36, the multiplexer 44 and the demultiplexer 46. In the chip-read mode the tri-state buffers 30, 32, and 34 are disabled, the tri-state buffer 36 is activated, and the multiplexer 44 selects the signal on the bus 50. The demultiplexer 46 is still disabled. The test clock signal latches the value from the tri-state buffer 36 into the data bit decoder of the serial/parallel scan register 42. In the pad-read mode the tri-state buffers 30, 34, and 36 are disabled, the tri-state buffer 32 is activated, and the multiplexer 44 selects the signal on the bus 48. The test clock signal latches the value from the tri-state buffer 32 into the data bit decoder.

In the chip-write mode the tri-state buffers 32, 34, and 36 are disabled, the tri-state buffer 30 is activated, and the demultiplexer 46 selects the signal on the bus 48. The multiplexer 44 is disabled. The test clock signal latches the value from the tri-state buffer 30 into the data bit decoder of the serial/parallel scan register 42. In the chip-read mode the tri-state buffers 30, 32, and 36 are disabled, the tri-state buffer 34 is activated, and the multiplexer 44 selects the signal on the bus 50. The test clock signal latches the value from the tri-state buffer 32 into the data bit decoder.

If the pad scan circuit 14 was in one of the read modes, after testing is complete it is necessary to set the S/P line to a digital one so that data may be scanned out from the chip in series, controlled by the test clock signal. In the output serial data stream, every third bit contains useful test results (the first and second bits being control bits). The pull-up resistors 38, 40, and 42 allow testing the tri-state buffers 30, 32, 34, and 36 and detecting bridging faults between chip interconnects, by applying a voltage at one of the pull-up resistors and checking for its presence or absence at another pull-up resistor.

Figure 3:
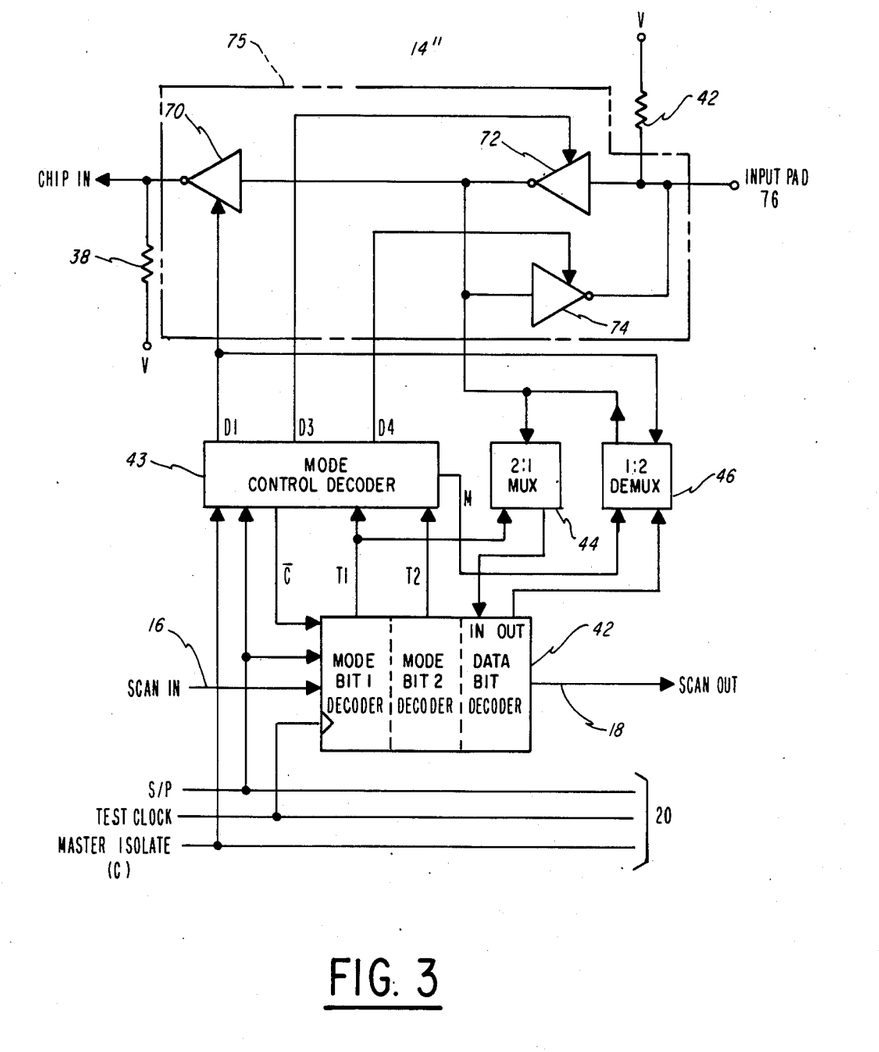
FIG. 3 is a block diagram of a second embodiment of the fault detection apparatus of the present invention.

The embodiment of the present invention illustrated in FIGS. 1 and 2 is intended for use on a chip where the I/O pad 12 is connected to chip functional circuitry and serves as both an input and an output terminal. For example in a memory, data is read into and read out of the memory from the same terminal. Thus the pad scan circuit 14 illustrated in FIG. 2 is suitable for use with a memory chip. It is also possible to use the inventive principles of the present invention in conjunction with a chip terminal that is dedicated for input or output use only. FIG. 3 illustrates a pad scan circuit 14″ for use at a chip terminal that functions only as an input point. An input pad 76 is shown in FIG. 3, and connected to chip input functional circuitry via tri-state buffers 70 and 72. A tri-state buffer 74 is connected in parallel with the tri-state buffer 72 as shown. The tri-state buffers 70, 72, and 74, which comprise a gate 75, are controlled by signals on lines D1, D3, and D4, respectively, from the mode decoder 43. Operation of the pad scan circuit 14″ is essentially the same as that of the pad scan circuit 14 illustrated in FIG. 2. When it is desired to read data into the chip functional circuitry, the tri-state buffers 70 and 72 are appropriately configured so that data may be read in from the input pad 76 to the chip circuitry. Test data can also be read in from the input pad 76 through the tri-state buffer 72 to the multiplexer 44. Test data can be sent from the demultiplexer 46 out through the input pad 76 via the tri-state buffer 74. Lastly, test data can be input to the chip from the demultiplexer 46 via the tri-state buffer 70.

Figure 4:
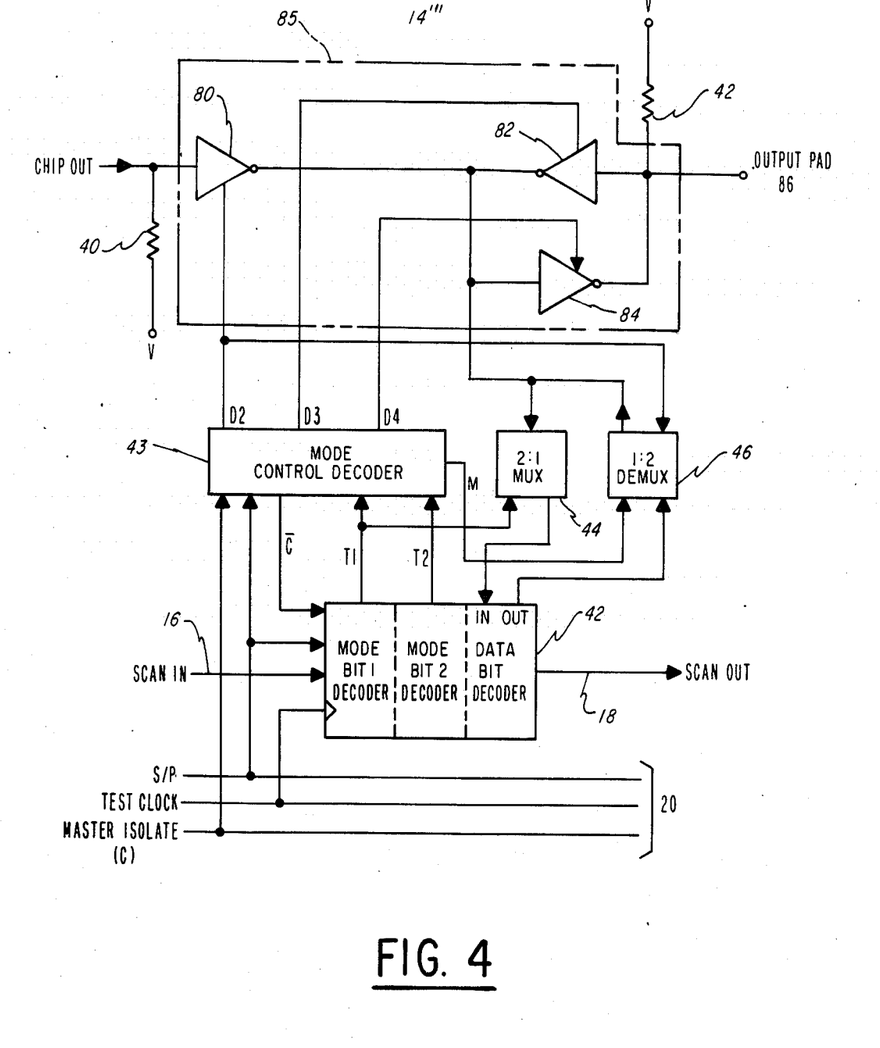
FIG. 4 is a block diagram of a third embodiment of the fault detection apparatus of the present invention.

A pad scan circuit 14‴ is illustrated in FIG. 4 for use in conjunction with chip output circuitry and an output pad 86. In normal operation, output data passes through tri-state buffers 80 and 82 to the output pad 86. Appropriate configuration of the tri-state buffers 80, 82, and 84 (which comprise a gate 85) also allow testing of the chip output circuitry and the output pad 86. Test data from the demultiplexer 46 can be sent to the output pad 86 via the tri-state buffer 82; this is the write-pad test mode. In the read-pad test mode test data at the output pad 86 passes through the tri-state buffer 84 to the demultiplexer 44. In the read-chip mode, data from the chip functional output circuitry passes through the tri-state buffer 80 to the multiplexer 44.

Figure 5:
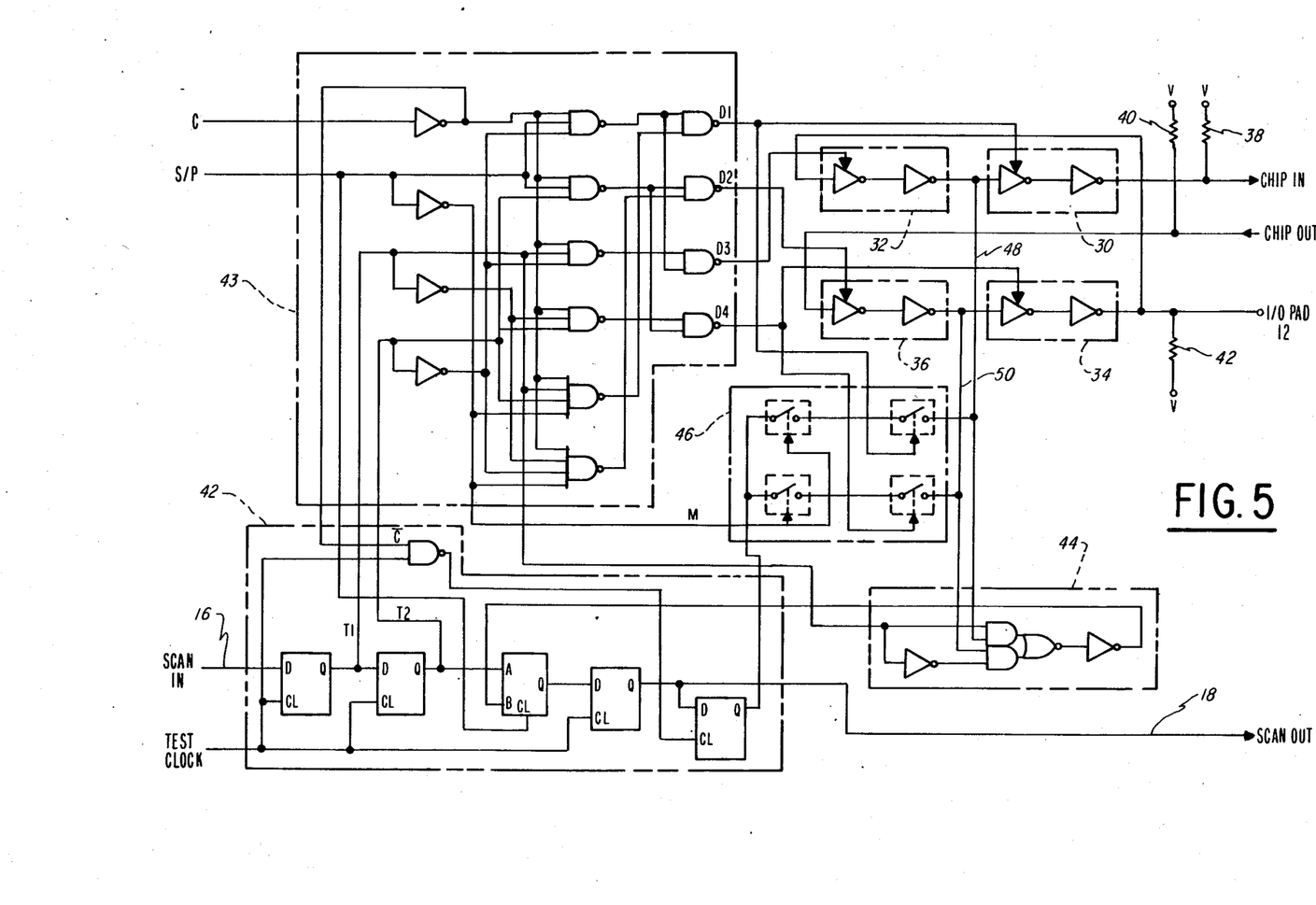
FIG. 5 is a detailed schematic diagram of the fault detection apparatus of FIG. 2.

FIG. 5 shows a preferred schematic embodiment of the various elements illustrated in block form in FIG. 2. The schematic elements in FIG. 5 are common logic gates well known to the integrated circuit designer.

What is claimed is:

1. An integrated circuit fault detection system wherein the integrated circuit has functional input terminals, functional output terminals, and a plurality of bonding pads, said integrated circuit fault detection system comprising:

first gate means having a bidirectional terminal adapted for connection to a bonding pad, a data output terminal adapted for connection to a functional input terminal, a test input terminal adapted for receiving input test data, and a test output terminal adapted for providing resultant test data, wherein the data path through said first gate means is selectable, and wherein during normal operation data at the bonding pad is supplied to the functional input terminal via said bidirectional terminal and said data output terminal, and wherein in a first fault testing mode test data from said test input terminal is selectably provided to one of the bonding pad and the functional input terminal, and wherein in a second fault testing mode test data at the bonding pad is selectably supplied to one of said functional input terminal and said test output terminal;

second gate means having a data input terminal adapted for connection to a functional output terminal, a bidirectional terminal adapted for connection to a bonding pad, a test input terminal adapted for receiving input test data, and a test output terminal adapted for providing resultant test data, wherein the data path through said second gate means is selectable, and wherein during normal operation data at the functional output terminal is supplied to the bonding pad via said data input terminal and said bidirectional terminal, and wherein during a first fault testing mode test data is selectably supplied to the bonding pad from one of said test input terminal and the functional output terminal, and wherein during a second fault testing mode test data is selectably supplied from one of the bonding pad and the functional output terminal to said test output terminal; and controller means for controlling said first and said second gate means to select the data path therethrough.

2. The integrated circuit fault detection system of claim 1 wherein the controller means includes a multiple-bit register and wherein the controller means is responsive to a multiple-bit pattern for selectably controlling the first and the second gate means.

3. The integrated circuit fault detection system of claim 2 wherein at least one bit in the multiple-bit pattern is an input test data bit.

4. The integrated circuit fault detection system of claim 2 wherein at least one bit in the multiple-bit pattern is a resultant test data bit, and wherein said resultant test data bit is sent off-chip for analysis.

5. The integrated circuit fault detection system of claim 1 wherein the first and the second gate means and the controller means are resident on the integrated circuit.

6. The integrated circuit fault detection system of claim 1 wherein each functional input terminal and each functional output terminal has associated therewith a first gate means and a second gate means, respectively, and a controller means.

7. The integrated circuit fault detection system of claim 6 wherein the first gate means and the second gate means are connected together in a ring fashion to allow test data to be clocked into any of the first gate means and the second gate means for propagation to any other first gate means and second gate means of the ring.

8. An integrated circuit fault detection system wherein the integrated circuit has functional bidirectional terminals connected to the chip functional circuitry and a plurality of bonding pads, said integrated circuit fault detection system comprising:

gate means having a first terminal connected to a bonding pad, a second terminal connected to a functional bidirectional terminal, a test input terminal adapted for receiving input test data, and a test output terminal adapted for providing resultant test data, wherein the data path through said gate means is selectable, and wherein during normal operation data is transferred between the bonding pad and the functional bidirectional terminal, and wherein in a first fault testing mode test data from said test input terminal is selectably supplied to one of the bonding pad and the functional bidirectional terminal, and wherein in a second fault testing mode test data at the bonding pad is selectably supplied to one of the functional bidirectional terminal and the test output terminal; and wherein in a third test mode test data from the functional bidirectional terminal is selectably supplied to the test output terminal and the bonding pad; and controller means for controlling said gate means to select the data path therethrough.

9. An integrated circuit fault detection system wherein the integrated circuit has functional input terminals, functional output terminals, and a plurality of bonding pads, said integrated circuit fault detection system comprising:

first gate means having a pad terminal adapted for connection to a bonding pad, a data output terminal adapted for connection to a functional input terminal, a test input terminal adapted for receiving input test data, and a test output terminal adapted for providing resultant test data, wherein the data path through said first gate means is selectable, and wherein during normal operation data at the bonding pad is supplied to the functional input terminal via said pad terminal and said data output terminal, and wherein during a first fault testing mode test data from said test input terminal is provided to the functional input terminal, and wherein during a second fault testing mode test data at the bonding pad is selectably supplied to one of the functional input terminal and said test output terminal;

second gate means having a data input terminal adapted for connection to a functional output terminal, a pad terminal adapted for connection to a bonding pad, a test input terminal adapted for receiving input test data, and a test output terminal adapted for providing a resultant test data, wherein the data path through said second gate means is selectable, and wherein during normal operation data at the functional output terminal is supplied to the bonding pad via said data input terminal and said pad terminal, and wherein during a first fault testing mode test data is selectably supplied to the bonding pad from one of said test input terminal and the functional output terminal and wherein during a second fault testing mode test data from the functional output terminal is supplied to said test output terminal; and controller means for controlling said first and said second gate means to select the data path therethrough.

10. The integrated circuit fault detection system of claim 9 wherein the controller means includes a multiple-bit register and wherein the controller means is responsive to a multiple-bit pattern for selectably controlling the first and the second gate means.

11. The integrated circuit fault detection system of claim 10 wherein at least one bit in the multiple-bit pattern is an input test data bit.

12. The integrated circuit fault detection system of claim 10 wherein at least one bit in the multiple-bit pattern is a resultant test data bit, and wherein said resultant test data bit is sent off-chip for analysis.

13. The integrated circuit fault detection system of claim 9 wherein the first and the second gate means and the controller means are resident on the integrated circuit.

14. The integrated circuit fault detection system of claim 9 wherein each functional input terminal and each functional output terminal has associated therewith a first gate means and a second gate means, respectively, and a controller means.

15. The integrated circuit fault detection system of claim 14 wherein the first gate means and the second gate means are connected together in a ring fashion to allow test data to be clocked into any of the first gate means and the second gate means for propagation to any other first gate means and second gate means of the ring.

* * * * *